United States Patent [19]

Zeisse et al.

[11] Patent Number: 4,721,836

[45] Date of Patent: Jan. 26, 1988

[54] APPARATUS FOR TRANSIENT ANNEALING OF SEMICONDUCTOR SAMPLES IN A CONTROLLED AMBIENT

[75] Inventors: Carl R. Zeisse; Edward R. Schumacher, both of San Diego, Calif.

[73] Assignee: The United States of America as represented by the Secretary of the Navy, Washington, D.C.

[21] Appl. No.: 862,952

[22] Filed: May 14, 1986

[51] Int. Cl.$^4$ .............................................. H05B 6/10
[52] U.S. Cl. ............................... 219/10.67; 219/10.69; 219/385; 432/11; 432/124; 414/182; 414/192
[58] Field of Search .......... 219/10.67, 10.69, 10.49 R, 219/385, 390; 432/11, 45, 148, 198, 124, 126, 122, 123; 414/180, 192, 182, 172, 147, 150; 148/1.5

[56] References Cited

U.S. PATENT DOCUMENTS

| | | | |
|---|---|---|---|
| 2,622,861 | 12/1952 | Talley | 432/239 X |
| 4,147,432 | 4/1979 | Yamawaki et al. | 219/10.67 X |
| 4,275,094 | 6/1981 | Takagi et al. | 65/36 |
| 4,355,974 | 10/1982 | Lee | 432/253 |
| 4,420,145 | 12/1983 | Martini | 432/122 X |
| 4,436,509 | 3/1984 | Kocmanek et al. | 432/253 |
| 4,449,037 | 5/1984 | Shibamata et al. | 219/10.49 R |
| 4,555,273 | 11/1985 | Collins et al. | 219/385 X |
| 4,626,203 | 12/1986 | Sakamoto | 414/180 X |

Primary Examiner—Philip H. Leung
Attorney, Agent, or Firm—R. F. Beers; E. F. Johnston; T. G. Keough

[57] ABSTRACT

An improved apparatus for annealing an ion-implanted semiconductor sample reduces the deleterious side effects otherwise associated with the process. A semiconductor sample, fabricated, for example, from indium phosphide or gallium arsenide, is set upon the fingers of a carrier which is displaced to the interior of an elongate furnace having its internal temperature maintained at the proper annealing temperature. Next, the fingers are rotated and the sample is placed on a number of razor blade-like edges extending up from an internal rack. The carrier is withdrawn and the sample is quickly brought to the annealing temperature for the precise period of time usually no more than 20 seconds. After the exact annealing period, the carrier is reintroduced and the fingers are rotated to lift the sample from the rack and the sample is withdrawn. Since only the sample is brought within the furnace and is placed on the preheated rack, it is immediately brought to the proper annealing temperature for the precise annealing duration that is ended by the immediate withdrawal of the sample from the furnace on the moveable carrier. Since the furnace, carrier and rack are in sealed enclosure, a non-oxidizing gas is provided to prevent oxidation and related degradation of the materials of the sample.

8 Claims, 5 Drawing Figures

APPARATUS FOR TRANSIENT ANNEALING OF SEMICONDUCTOR SAMPLES IN A CONTROLLED AMBIENT

STATEMENT OF GOVERNMENT INTEREST

The invention described herein may be manufactured and used by or for the Government of the United States of America of governmental purposes without the payment of any royalties thereon or therefor.

BACKGROUND OF THE INVENTION

The field of the invention generally relates to semiconductor fabrication techniques and the apparatus for implementing same. In greater particularity, it refers to an apparatus and method for reducing the deleterious effects of ion implantation in a semiconductor sample. In still more greater particularity, the apparatus and method of this invention concern an improved annealing of a semiconductor surface that reduces the deleterious effects of ion implantation in a semiconductor by assuring a precisely maintained annealing temperature for a precisely measured period of time for a sample being annealed after an ion implantation procedure.

Ion implantation is an established method for changing the conductivity (doping) of a semiconductor. It has been used to create a uniformly conductive layer with a thickness on the order of a few tenths of a micron or to create islands of conductivity within a seal of semi-insulating material. This latter capability has demonstrated great utility for ion implantation in the fabrication of high speed planar integrated circuits in semi-insulating materials such as gallium arsenide (GaAs) or indium phosphide (InP).

A pure ion beam of the proper dopant is directed onto a sample surface during a selective implantation procedure. The sample surface previously has been masked to allow the beam to strike some areas and not others. The ions penetrate beneath the semiconductor surface where they remain. The semiconductor, initially a single crystal, usually is heavily damaged during the implant procedure. In fact, at heavy ion doses, it is well established that the semiconductor will become amorphous in the implanted region. Following the implant, the mask is removed and the sample is annealing by raising it to a temperature in the range of 700° to 1000° C. The annealing accomplishes two things: first, it removes most of the damage; and, second, it makes the implanted impurities electrically active. However, even though a conventional annealing process does provide these advantages, the anneal is the primary source of difficulties in the ion implantation process. This also holds true even for silicon which can easily withstand such temperatures.

The reason for the difficulty is that the implanted impurities tend to migrate in an uncontrolled fashion during long lasting anneals in a furnace. Particularly in the case of gallium arsenide and indium phosphide compound semiconductors which can be made more reliably semi-insulating than silicon, there are in addition the more severe problems associated with substrate decomposition that is due to the loss of arsenic or phosphorus at high temperatures. Consequently, the gallium arsenide and indium phosphide samples must be protected during the annealing procedure. One way the samples are protected is to provide a dielectric cap that is deposited on the sample surface to help prevent decomposition.

Reduction of the annealing time has, in general, proven to be beneficial in minimizing the problems associated with the anneal. An indium phosphide wafer with a thickness of 0.020 inches has a thermal time constant of about 10 milliseconds, and other semiconductors in water form will respond about this rapidly to a temperature change. Consequently, a variety of methods have evolved for rapid annealing of semiconductor samples. A typical effort is the "Furnace Transient Anneal Process" of David A Collins et al in their U.S. Pat. No. 4,555,273. This process uses a movable furnace which is rapidly rolled over a sample resting on a low thermal mass support. It is a relatively uncomplicated process which operates near thermal equilibrium and therefore produces sample temperatures which can be measured with a degree of confidence. It has demonstrated a capability of annealing capped samples of ion implanted indium phosphide for times in the order of 20 seconds at temperatures of 700° C. with a consequent marked reduction in the motion of implanted and residual impurities. Because a sample and the carrier are heated by a movable furnace, which are exposed to ambient air, some impurities can be introduced that could degrade some materials.

Thus, a continuing need exists in the state of the art for an apparatus and method of annealing a semiconductor sample that assures an exposure of a sample at a precise temperature for a precisely measured period in a nonreactive gas medium.

SUMMARY OF THE INVENTION

The present invention is directed to providing an improved apparatus and method for annealing a semiconductor sample. A moveable carrier having a number of fingers supporting the sample is axially displaced within a sealed furnace to bring the sample to a position that is immediately above a multibladed rack within the furnace. The fingers are rotated and the carrier is withdrawn to deposit the sample on the multibladed rack for annealing in the furnace at a proper temperature for a precise period of time. When the precise time has elapsed, the fingered-carrier is brought to interdigitally extend within the multibladed rack. The fingers are rotated to lift the sample from the rack onto the fingers to permit the sample's immediate withdrawal. Optionally, a non-oxidizing gas such as hydrogen fills the furnace to prevent oxidation or other degradation of materials of the sample which might otherwise be attributed to oxygen or other constituents of ambient air.

A prime object of the invention is to provide an improvement for an apparatus and method for annealing semiconductor samples.

Still another object is to provide an improved annealing of a semiconductor by assuring a proper annealing temperature for a precise period of time.

Yet another object of the invention is to provide for an improved annealing of a semiconductor sample by having a non-oxidizing gas present during the annealing procedure.

Still yet a further object of the invention is to provide for an improved annealing of a semiconductor sample by the inclusion of a removeable semiconductor sample carrier that does not act as a heat sink which might otherwise interfere with the annealing process.

Yet another object is to provide for an improved annealing of a semiconductor sample that assures a proper period of annealing at the right temperature by allowing an immediate placing on and withdrawing from a multibladed rack within a precisely controlled annealing furnace.

Still another object is to provide for an improved annealing of a semiconductor sample in a sealed furnace having an non-corrosive gas therein and a removeable semiconductor sample carrier placing and withdrawing the sample on a preheated multibladed rack.

These and other objects of the invention will become more readily apparent from the ensuing specification when taken with the appended drawings and in conjunction with the claims.

DESCRIPTION OF THE PREFERRED EMBODIMENTS

Figure 1:
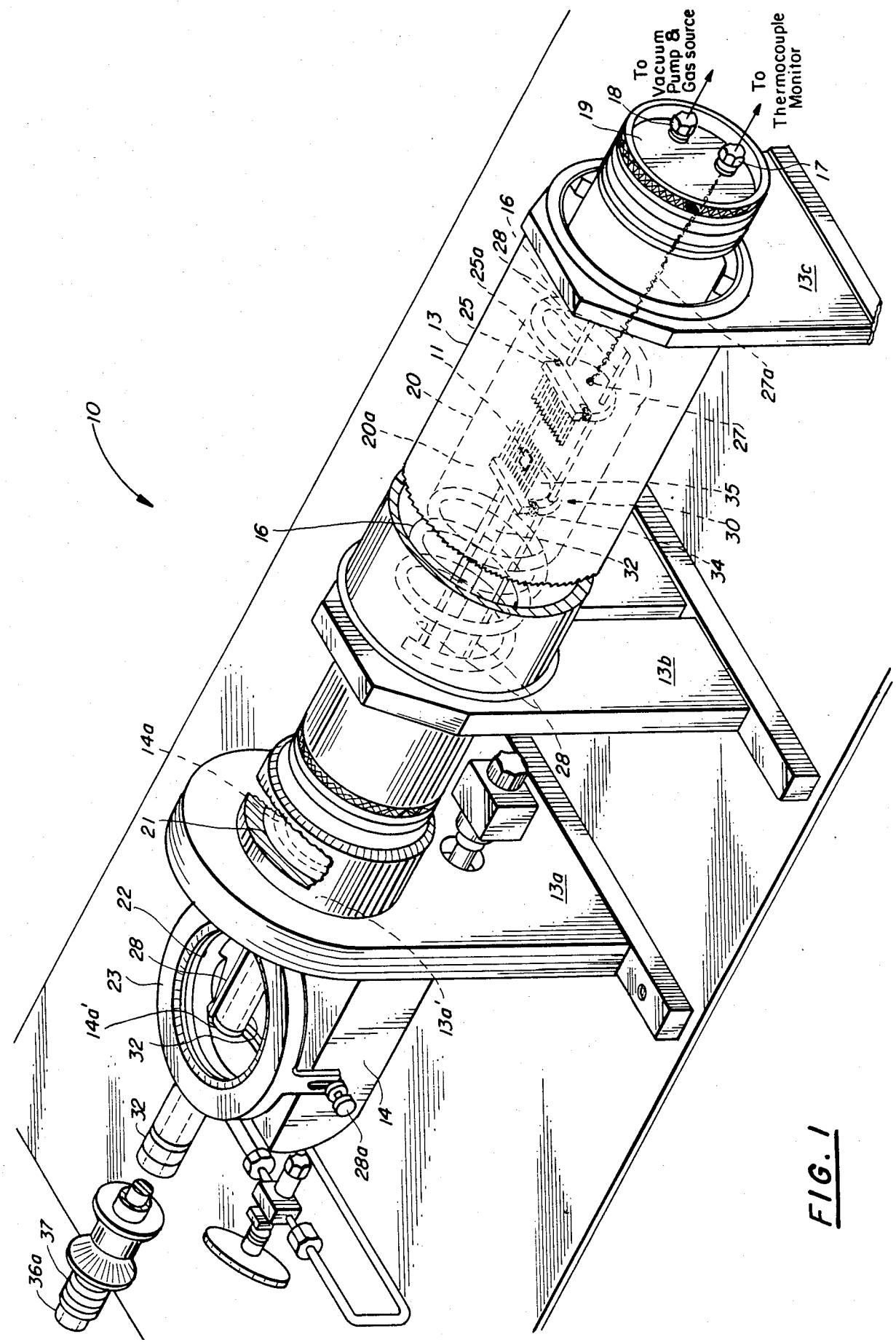
FIG. 1 is an isometric depiction of the apparatus for performing the improved annealing of a semiconductor sample.

Referring now to FIG. 1 of the drawings, the improved apparatus 10 is shown that improves the annealing of a semiconductor sample 11. A furnace 13 is used to bring the sample's temperature to the proper annealing temperature, in the neighborhood of 700° to 1000° C. One of several commercially available units manufactured by Trans-Temp Co. of Chelsey, Mass. has been selected as the annealing heat source. The furnace has a cylindrical configuration defined by an outer transparent wall having a gold, reflective inner coating. The coating helps the furnace reach the annealing temperature by reflecting heat emanating from a helically extending coil 16.

A control fitting 17 for temperature sensing leads and a gas fitting 18 are provided in an end wall 19. The helically extending coil has leads, not shown, that extend to a power source and control to draw current in varying amounts depending on the internal temperature desired and is under control of a sensor to be described below. Fitting 18 on the end wall 19 of the furnace and a quartz tube 20 can serve a dual purpose. First, a vacuum pump may be connected to evacuate a chamber 20a in the quartz tube and second, it allows for the introduction of a selective gas such as a non-oxidizing gas to achieve greater benefits in the annealing process in a manner to be elaborated on below. Furnace 13 is fixed in place by three supports 13a, 13b and 13c.

Coaxially extending quartz tube 20 reaches end for end through furnace 13 and occupies space within coil 16 that is heated to the precise temperature. The quartz tube abuts and is sealed against wall 19. The opposite end 21 of the quartz tube is also sealed along or bonded onto a planar surface 13a' to help enclose a sealed chamber 20a in which semiconductor sample 11 is deposited for the annealing procedure.

Figure 3:
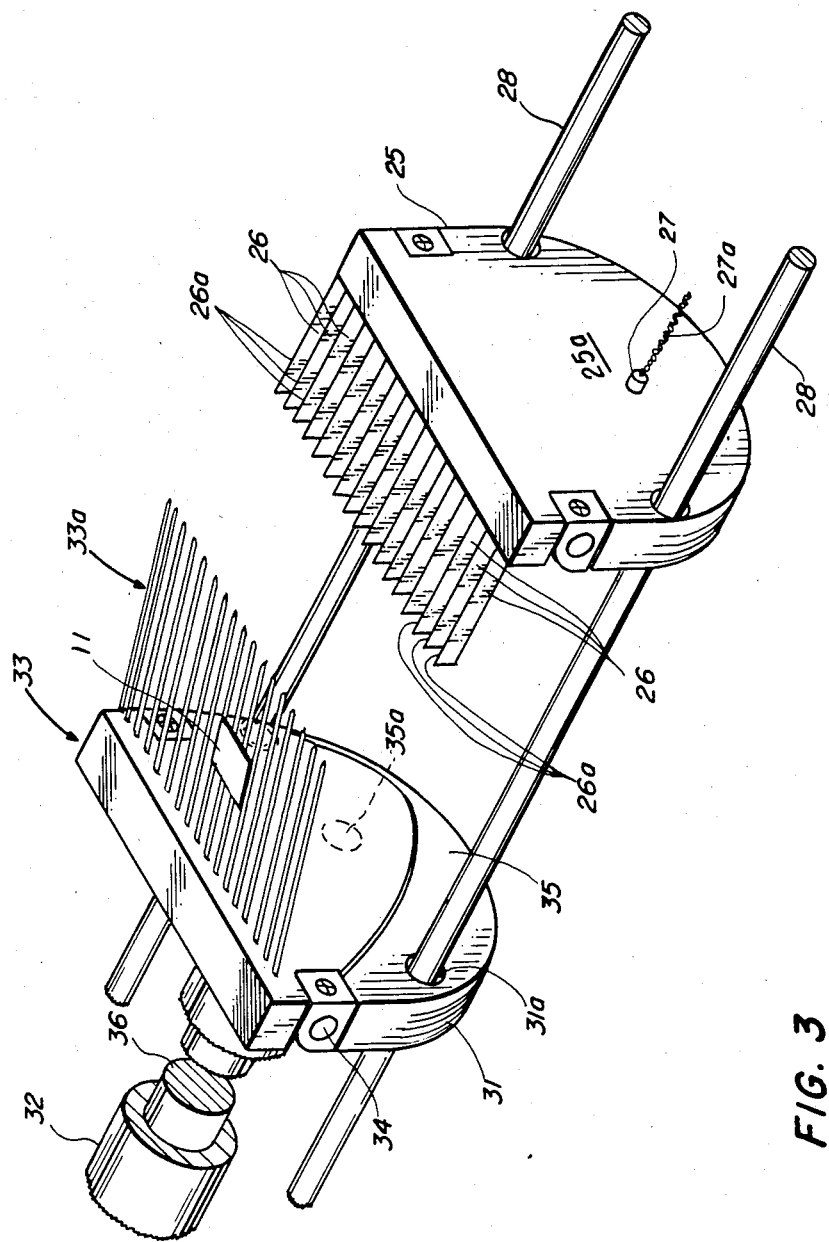
FIG. 3 is an isometric depiction of the moveable bracket having the rotatable fingers rotated upward and carrying the semiconductor sample prior to placing it on the multibladed rack within the furnace.
Figure 4:
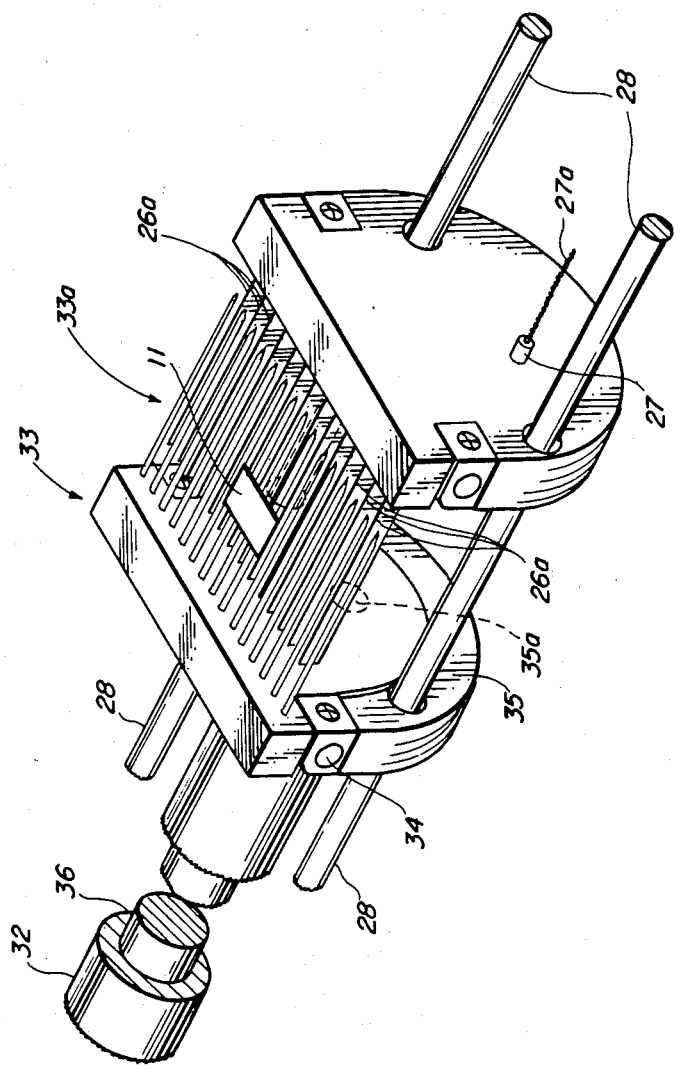
FIG. 4 shows the fingers of the moveable bracket rotated downward to place the semiconductor sample on the top of the rack blades within the furnace to begin the precise duration of the annealing process.
Figure 5:
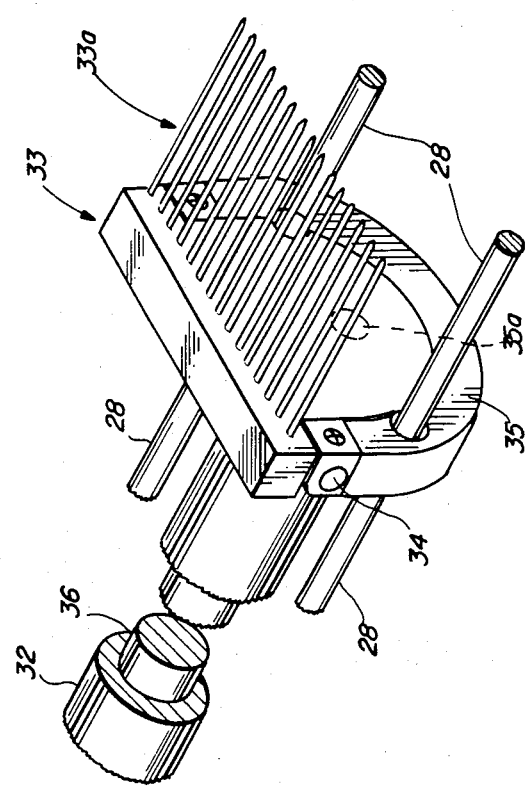
FIG. 5 shows the moveable bracket being withdrawn from the furnace as the semiconductor sample begins its annealing.

A rack assembly 25 is fixedly mounted on a pair of alumina rods 28 within the quartz tube, see FIGS. 3 and 4. The rack assembly has a base member 25a and a plurality of thin edge support members 26 whose upper edges 26a are substantially coplanar to define a multiple thin edge support surface for semiconductor sample 11.

The thin edge support members consist of about 20 narrow stainless steel blades each approximately 0.010 inches thick mounted in parallel to each other in steel base member 25a. The blades have a uniform spacing and are parallel one to another so that upper edges 26a lie in substantially the same plane. A thermocouple 27 is provided in the base member 25a of the rack assembly to precisely indicate the temperature thereof. A lead 27a reaches from the thermocouple through fitting 17 and to external monitoring and control circuitry. The temperature indicated by the thermocouple would be substantially the same as the temperature of the space within chamber 20a in the quartz tube.

Figure 2:
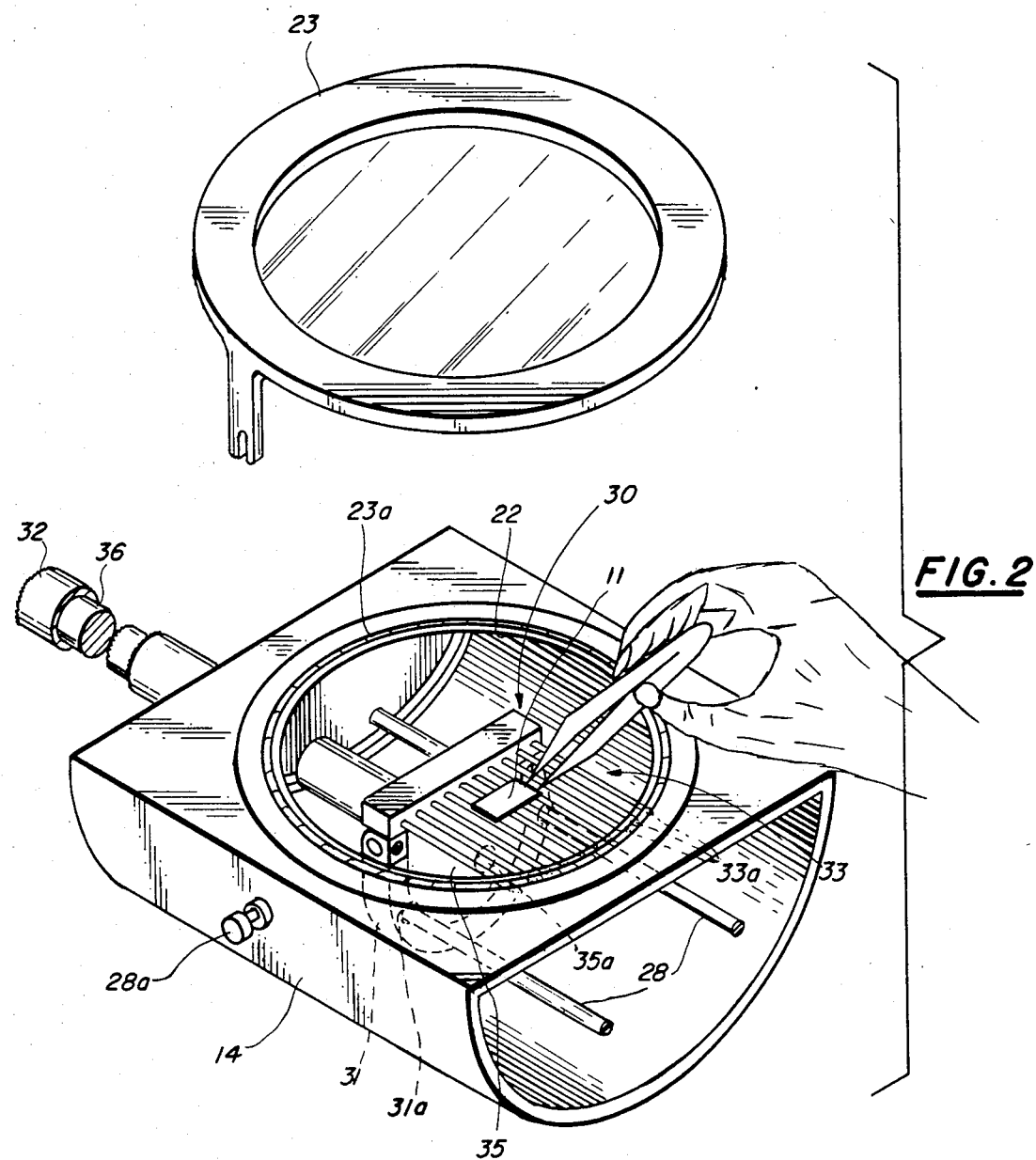
FIG. 2 shows a partially isometric top view of a portion of the apparatus with an inspection port cover removed and the placing of a semiconductor sample on the fingers of a movable bracket.

Adjacent to where opposite end 21 of the coaxially extending quartz tube is sealed on planar surface 13a', a port 22 is provided on an extension 14 of furnace 13. The extension communicates with chamber 20a via an opening 14a and retains the chamber's sealed integrity with a sealed cover 23 that provides access to chamber 20a. The cover mates with an O-ring 23a, to assure that the chamber is sealed when the cover is properly positioned and secured by a pair of diametrically opposed securing nuts 28a, only one of which is shown in FIGS. 1 and 2.

The port and cover allow a technician easy access to place a semiconductor sample onto a moveable carrier 30 which is slidably mounted on alumina rods 28. The carrier has a bracket 31 provided with a pair of bores 31a that are larger than the diameter of the alumina rods so that the carrier can slidably traverse the length of the rods from beneath port 22 to where rack assembly 25 is fixedly mounted on the rods. A tube 32 is secured to the bracket and extends through a sealed fitting provided in a wall in extension 14 to permit the selective positioning of the moveable carrier from the access port to the rack assembly while maintaining the sealed isolation of chamber 20a from the ambient.

The movable carrier is provided with a multifinger assembly 33 that is pivotally mounted or journaled onto bracket 31 via a pair of pins 34. Fingers 33a of the multifinger assembly have a length which substantially corresponds to the length of the blades of thin edge support members 26. The fingers are disposed so as to maintain a juxtaposed or interdigital relationship when the moveable carrier has been axially displaced by tube 32 to be a close proximity position in chamber 20a, as shown in FIG. 4. A downwardly reaching tongue or lever 35 extends from bracket 31 and is engaged by a push rod 36 at a bearing surface 35a. The push rod is coaxially disposed within tube 32 and reaches through an opening (not shown) in bracket 31 to bear on surface 35a.

The push rod is selectably actuated by an appropriately reaching projection 36a that is accessible through a suitably fitted bellows sleeve 37 on the distal end of tube 32. Because of the pivotal mounting of the multifingered assembly 33 on bracket 31 via pins 34, the weight of the multifinger assembly biases the push rod so that projection 36a flexes bellows sleeve 37 to extend from tube 32. Pushing projection 36a coaxially toward chamber 20a rotates multifinger assembly 33 in a counter clockwise direction to raise the fingers above the plane normally defined by upper edges 26a of the thin edge support members 26. This coaction provides a salient feature of this combination to assure proper timing of the annealing process.

In operation of the invention, furnace 13 is preheated to the proper temperature. Movable carrier 30 is withdrawn from chamber 20a and positioned beneath cover 28. After removing the cover, a semiconductor sample 11 is placed on fingers 33a and the cover is replaced.

Rack assembly 25 is fixed inside of the furnace and is hot at the annealing temperature of interest. The temperature is sensed by thermocouple 27 and appropriate levels of power are delivered to the heating coats to maintain the proper annealing temperature.

Since both the moveable carrier 30 and fixed rack assembly 25 are enclosed in extension 14 and chamber 20a, the chamber now may be evacuated, if needed, via fitting 18 and selectively flushed with a controlled composition of gases at approximately one atmosphere of pressure. This controlled composition of gases is preferably non-oxidizing gases so as to prevent oxidation or a related degradation of the semiconductor sample during the annealing process. Hydrogen has functioned well in this regard.

Projection 36a of push rod 36 is depressed to push against surface 35a and lever 35 is deflected to rotate multifinger assembly 33 counterclockwise about pins 34. This raises the multifingered assembly and semiconductor sample 11 above the plane defined by upper edges 26a of thin edge support members 26. Tube 32 is pushed inside of chamber 20a and moveable carrier 30 is brought to a position which locates semiconductor sample 11 above upper edges 26a of thin edge support members 26. Releasing pressure on projection 36a of push rod 36 allows multifinger assembly 33 to rotate clockwise about pins 34. Semiconductor sample 11 is placed on upper edges 26a of the thin edge support members.

At this moment semiconductor sample 11 begins its annealing for the precise period of time required as determined by the constituents of the sample. As soon as the semiconductor sample is placed on the upper edges 26a, moveable carrier 30 is withdrawn from chamber 20a by withdrawing tube 32 into and through the area enclosed in extension 14; this takes but a moment. When the proper time has elapsed, usually only fifteen to twenty seconds, the moveable carrier is again extended with the multifingered assembly reaching under the semiconductor sample that is supported on upper edges 26a. Projection 36a is depressed to raise the fingers and the semiconductor sample is lifted from the upper edges of the rack assembly. Withdrawal of tube 32 withdraws semiconductor sample 11 from chamber 20a; this takes but a second.

The aforedescribed apparatus and method of annealing assures a simplicity, an operation near thermal equilibrium of the sample, an excellent thermal uniformity throughout the sample and ease of scaling to larger sample dimensions. Evacuating chamber 20a removes contaminants such as moisture which might otherwise interfere with the anneal process. Inclusion of a chemically stable gas, such as a non-oxidizing gas, avoids the problems normally associated with unwanted oxidation of constituents of the semiconductor sample or other degrading actions. Nickel and chromium have been found to rapidly oxidize so that inclusion of a non-oxidizing gas is strongly recommended where these elements are present on the semiconductor sample to be annealed.

Since only the semiconductor sample is heated, the sole thermal load on the system is the sample because the moveable carrier is withdrawn immediately after depositing it on preheated rack assembly 25. Since the thermal mass is held in an absolute minimum, the response time will be as rapid as possible.

Because of the dimensions of the rack, the coaxially extending quartz tube 20 has about a two inch diameter so that a wide range of sample shapes and sizes can be accommodated. While all the materials can be selected from various metals and other components, high heat capacity materials can be selected to maximize thermal contact with the sample.

Obviously, many modifications and variations of the present invention are possible in the light of the above teachings. It is therefore to be understood that within the scope of the appended claims the invention may be practiced otherwise than as specifically described.

We claim:

1. An apparatus for annealing a semiconductor sample at a precise temperature for a specific duration comprising:

means stationary mounted for inductively heating a contained volume to the precise temperature;

means extending through the heated contained volume of the inductively heated means enclosing a chamber therein;

a thin edged support rack disposed in the enclosed chamber;

means disposed adjacent said enclosed chamber for selectively extending therein in a moveable relationship with respect to the stationary mounted inductively heating means;

means connected to the selectively extending means and in sealing isolation with the enclosed chamber having fingers pivotable about the thin edged support rack for carrying the semiconductor sample thereon; and means disposed within the selectively extending means for rotating the pivotable fingers of the carrying means upward as the selectively extending means brings the semiconductor sample to the thin edged support rack and for rotating the pivotable fingers downward when the fingers coextend with the thin edged support rack to deposit the semiconductor sample theron for the annealing thereof for the specific duration and the withdrawal of the selectively extending means and carrying means.

2. An apparatus according to claim 1 wherein the selectively extending means and the carrying means are configured to be extended to pick up and withdraw the annealed semiconductor sample after the specific duration.

3. An apparatus according to claim 2 in which the thin edged support rack includes a temperature sensor for indicating the precise temperature within the chamber to control the inductively heating means.

4. An apparatus according to claim 3 in which the chamber enclosing means is provided with a means for introducing a non-oxidizing gas into the chamber to prevent oxidation and other degradation of the semiconductor sample.

5. An apparatus according to claim 4 in which the chamber enclosing means is a sealed quartz tube communicating with a selectively removeable window that is located outside of the contained volume of the inductively heating means to permit the placing of the semiconductor sample therein.

6. An apparatus according to claim 5 in which the selectively extending means is a tube connected to a bracket portion of the carrying means and the rotating means is a push rod coaxially disposed in the tube and abutting a lever connected to the fingers of the carrying means to effect the selective rotation of the fingers counterclockwise-upward or clockwise-downward.

7. An apparatus according to claim 6 in which the inductively heating means is a helical coil about the sealed quartz tube.

8. An apparatus according to claim 7 in which the thin edged support rack is preheated in the sealed quartz tube and has a number of thin edges for supporting the semiconductor sample to avoid concentrating and creating hotter spots on the semiconductor sample, as the sample temperature rises to its final equilibrium value.

* * * * *